United States Patent
Sridharan et al.

(10) Patent No.: US 8,093,491 B2
(45) Date of Patent: Jan. 10, 2012

(54) LEAD FREE SOLAR CELL CONTACTS

(75) Inventors: Srinivasan Sridharan, Strongsville, OH (US); Tung Pham, Vista, CA (US); Chandrashekhar S. Khadilkar, Broadview Heights, OH (US); Aziz S. Shaikh, San Diego, CA (US); Steve S. Kim, Goleta, CA (US)

(73) Assignee: Ferro Corporation, Cleveland, OH (US)

( * ) Notice: Subject to any disclaimer, the term of this patent is extended or adjusted under 35 U.S.C. 154(b) by 898 days.

(21) Appl. No.: 11/145,538

(22) Filed: Jun. 3, 2005

(65) Prior Publication Data
US 2006/0289055 A1    Dec. 28, 2006

(51) Int. Cl.
*H01L 31/042*    (2006.01)

(52) U.S. Cl. ......... 136/256; 136/252; 136/261; 136/265

(58) Field of Classification Search ........... 136/243–265
See application file for complete search history.

(56) References Cited

U.S. PATENT DOCUMENTS

| | | |
|---|---|---|
| 3,615,772 A | 10/1971 | Kohut |
| 3,839,231 A | 10/1974 | Patterson et al. |
| 4,152,282 A | 5/1979 | Baudry et al. |
| 4,153,907 A | 5/1979 | Kofron |
| 4,220,547 A | 9/1980 | Abe et al. |
| 4,256,513 A * | 3/1981 | Yoshida et al. ............... 136/256 |
| 4,283,591 A * | 8/1981 | Boer ............................. 136/256 |
| 4,293,451 A * | 10/1981 | Ross ............................ 252/512 |
| 4,323,652 A | 4/1982 | Baudry et al. |
| 4,379,319 A | 4/1983 | Wilson |
| 4,400,214 A | 8/1983 | Ogawa et al. |
| 4,486,232 A | 12/1984 | Nakatani et al. |
| 4,517,155 A | 5/1985 | Prakash et al. |
| 4,880,567 A | 11/1989 | Prabhu et al. |
| 4,906,406 A | 3/1990 | Hormadaly |
| 5,051,381 A | 9/1991 | Ohji et al. |
| 5,118,362 A | 6/1992 | St. Angelo et al. |
| 5,151,377 A | 9/1992 | Hanoka et al. |
| 5,165,986 A | 11/1992 | Gardner et al. |
| 5,198,154 A | 3/1993 | Yokoyama et al. |
| 5,296,426 A | 3/1994 | Burn |
| 5,378,408 A | 1/1995 | Carroll et al. |
| 5,439,852 A | 8/1995 | Hormadaly |
| 5,468,695 A * | 11/1995 | Carroll et al. ................... 501/79 |
| 5,470,506 A * | 11/1995 | Tanigami et al. ......... 252/520.22 |
| 5,491,118 A | 2/1996 | Hormadaly |
| 5,645,765 A | 7/1997 | Asada et al. |
| 5,698,451 A | 12/1997 | Hanoka |
| 5,753,571 A | 5/1998 | Donohue |
| 5,805,409 A | 9/1998 | Takahara et al. |
| 5,841,044 A | 11/1998 | Weise et al. |
| 5,948,320 A | 9/1999 | Nikaidoh et al. |
| 5,948,536 A | 9/1999 | Suzuki et al. |
| 6,036,889 A | 3/2000 | Kydd |
| 6,071,437 A * | 6/2000 | Oya .............................. 252/514 |
| 6,105,394 A | 8/2000 | Sridharan et al. |
| 6,124,224 A | 9/2000 | Sridharan et al. |
| 6,171,987 B1 | 1/2001 | Hormadaly |
| 6,185,087 B1 | 2/2001 | Park et al. |
| 6,225,392 B1 | 5/2001 | Sunahara |
| 6,245,699 B1 * | 6/2001 | Hudecek et al. ................ 501/18 |
| RE37,512 E | 1/2002 | Szlufcik et al. |
| 6,556,422 B2 | 4/2003 | Kim et al. |
| 6,572,793 B2 | 6/2003 | Fukui et al. |
| 6,632,730 B1 | 10/2003 | Meier et al. |
| 6,649,554 B1 | 11/2003 | Chang et al. |
| 6,664,631 B2 | 12/2003 | Meier et al. |
| 6,673,274 B2 | 1/2004 | Venigalla et al. |
| 6,710,239 B2 * | 3/2004 | Tanaka .......................... 136/244 |
| 7,176,152 B2 * | 2/2007 | Brown et al. ................... 501/16 |
| 2002/0148499 A1 | 10/2002 | Tanaka |
| 2003/0003693 A1 * | 1/2003 | Meier et al. .................... 438/476 |
| 2004/0029703 A1 * | 2/2004 | Sridharan et al. ............... 501/73 |
| 2005/0051254 A1 | 3/2005 | Carroll et al. |
| 2006/0231801 A1 | 10/2006 | Carroll et al. |
| 2006/0231804 A1 * | 10/2006 | Wang et al. .................... 252/500 |

FOREIGN PATENT DOCUMENTS

| AU | 2006201556 | 11/2006 |
|---|---|---|
| JP | 58083073 A | 5/1983 |

OTHER PUBLICATIONS

Khadilkar et al., "Characterization of Front Contact in a Silicon Solar Cell," presented Aug. 10-13, 2003.

Shaikh et al., "Designing a Front Contact Ink for SiNx Coated Polycrystalline Si Solar Cells," presented May 11-18, 2003.

Surek, "Progress in U.S. Photovoltaics: Looking Back 30 Years and Looking Ahead 20," 3rd World Conference, Osaka, Japan, May 11-18, 2003, pp. 1-6.

* cited by examiner

*Primary Examiner* — Keith D. Hendricks
*Assistant Examiner* — Bach Dinh
(74) *Attorney, Agent, or Firm* — Rankin, Hill & Clark LLP

(57) ABSTRACT

Formulations and methods of making solar cells are disclosed. In general, the invention presents a solar cell contact made from a mixture wherein the mixture comprises a solids portion and an organics portion, wherein the solids portion comprises from about 85 to about 99 wt % of a metal component, and from about 1 to about 15 wt % of a lead-free glass component. Both front contacts and back contacts are disclosed.

27 Claims, No Drawings

LEAD FREE SOLAR CELL CONTACTS

FIELD OF THE INVENTION

This invention relates to lead-free and cadmium-free paste compositions and a method of making contacts for solar cells as well as other related components used in fabricating photovoltaic cells.

BACKGROUND

Solar cells are generally made of semiconductor materials, such as silicon (Si), which convert sunlight into useful electrical energy. Solar cells are, in general, made of thin wafers of Si in which the required PN junction is formed by diffusing phosphorus (P) from a suitable phosphorus source into a P-type Si wafer. The side of the silicon wafer on which sunlight is incident is generally coated with an anti-reflective coating (ARC) to prevent reflective loss of sunlight, which increases the solar cell efficiency. A two dimensional electrode grid pattern known as a front contact makes a connection to the N-side of silicon, and a coating of aluminum (Al) makes connection to the P-side of the silicon (back contact). Further, contacts known as silver rear contacts, made out of silver or silver-aluminum paste are printed and fired on the N-side of silicon to enable soldering of tabs that electrically connect one cell to the next in a solar cell module. These contacts are the electrical outlets from the PN junction to the outside load.

Conventional pastes for solar cell contacts contain lead frits. Inclusion of PbO in a glass component of a solar cell paste has the desirable effects of (a) lowering the firing temperature of paste compositions, (b) facilitating interaction with the silicon substrate and, upon firing, helping to form low resistance contacts with silicon. For these and other reasons PbO is a significant component in many conventional solar cell paste compositions. However, in light of environmental concerns, the use of PbO (as well as CdO), in paste compositions is now largely avoided whenever possible. Hence a need exists in the photovoltaic industry for lead-free and cadmium-free paste compositions, which afford desirable properties using lead-free and cadmium-free glasses in solar cell contact pastes.

SUMMARY OF THE INVENTION

The present invention provides lead-free and cadmium-free glass compositions for use in solar cell contact paste materials that provide low series resistance ($R_S$) and high shunt resistance ($R_{sh}$) to give high performance solar cells, as measured by efficiency ($\eta$) and fill factor (FF). Generally, the present invention includes a solar cell comprising a contact, made from a mixture wherein, prior to firing, the mixture comprises a solids portion and an organics portion. The solids portion comprises from about 85 to about 99 wt % of a conductive metal component and from about 1 to about 15 wt % of a lead-free glass component.

The compositions and methods of the present invention overcome the drawbacks of the prior art by optimizing interaction, bonding, and contact formation between contact components, typically silicon with either Ag (front contact) or Al (back contact) or Ag (silver rear contact), through the lead-free glass medium. A conductive paste containing glass and silver, or glass and aluminum, is printed on a silicon substrate, and fired to fuse the glass and sinter the metal therein. For a silver rear contact, the metal component may comprise silver, or a combination of silver and aluminum powders and/or flakes. Upon firing, for a front contact, Ag/Si conductive islands are formed providing conductive bridges between bulk paste and silicon wafer. In a front contact, the sequence and rates of reactions among glasses, metals and silicon, occurring as a function of temperature are factors in forming the low resistance contact between the silver paste and silicon wafer. The interface structure consists of multiple phases: substrate silicon, Ag/Si islands, Ag precipitates within the insulating glass layer, and bulk silver. The glass forms a nearly continuous layer between the silicon interface and the bulk silver. For a back contact, upon firing, a $p^+$ layer forms on the underlying silicon by liquid-phase epitaxy. This occurs during the resolidification of the aluminum-silicon (Al—Si) melt. High-bismuth lead-free and cadmium-free glasses allow low firing temperatures in making front contacts owing to their excellent flow characteristics relatively at low temperatures. Relatively high-silicon, low bismuth lead-free and cadmium-free glasses provide suitable properties for back contacts, without excessive interaction with backside Si. Similarly, high-bismuth lead-free and cadmium-free glasses allow the formation of suitable lead-free silver rear contacts on backside Si with optimal interaction with both Si and back contact Al layer.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

Broadly, the invention provides a solar cell contact made from a mixture wherein, prior to firing, the mixture comprises a solids portion and an organics portion, wherein the solids portion comprises from about 85 to about 99 wt %, preferably about 88 to about 96 wt % of a conductive metal component, and from about 1 to about 15 wt %, preferably about 2 to about 9 wt % and more preferably about 3 to about 8 wt % of a glass component, wherein the glass component is lead-free and cadmium-free. A solar panel comprising any solar cell herein is also envisioned. When the solar cell contact is a front contact, the metal component preferably comprises silver, and the glass component comprises from about 5 to about 85 mol % $Bi_2O_3$, and from about 1 to about 70 mol % $SiO_2$. The compositions used in making front contacts are also useful in making a busbar (silver rear contact) for a solar cell back contact. A silver (or silver-aluminum) rear contact in the back makes contact with both Si and the Al back contact layer, even though back contact Al also directly contacts Si. The silver rear contact in the back contact helps to solder connecting tabs to the solar cells that connect one cell to the next in a solar cell module. In a back contact, the metal component preferably comprises aluminum, and the glass component comprises from about 5 to about 55 mol % $Bi_2O_3$, from about 20 to about 70 mol % $SiO_2$, and from about 0.1 to about 35 mol % $B_2O_3$.

Broadly, silver- and glass-containing thick film pastes are used to make front contacts for silicon-based solar cells to collect current generated by exposure to light. While the paste is generally applied by screen-printing, methods such as extrusion, pad printing, and hot melt printing may also be used. Solar cells with screen-printed front contacts are fired to relatively low temperatures (550° C. to 850° C. wafer temperature; furnace set temperatures of 650° C. to 1000° C.) to form a low resistance contact between the N-side of a phosphorus doped silicon wafer and a silver based paste. Methods for making solar cells are also envisioned herein.

Aluminum- and glass-containing back contacts are used to form low resistance ohmic contacts on the back side of the solar cell due to large area melting and re solidification of Al doped ($p^+$) epitaxially grown Si layer which increases the solar cell performance due to improved back surface field. For optimum performance a thick $p^+$ re-grown region is believed to be ideal. It is also believed that the rejection of metallic impurities from the epitaxially growing $p^+$ layer leads to high carrier lifetimes. These two factors are believed to increase the open circuit voltage, and more importantly, the open circuit voltage falls only slightly as the bulk resistivity increases. Therefore solar cell performance improves due to the formation of substantial epitaxially re grown $p^+$ layer in the Al back contact. Therefore the interaction of lead-free and cadmium-free glass in the back contact paste, with Si should be minimal, and its interaction with Al should be enough to form a continuous Al layer without beading.

Paste Glasses. The glass component of the pastes comprises, prior to firing, one or more glass compositions. Each glass composition comprises oxide frits including, at a minimum, $Bi_2O_3$ and $SiO_2$. In particular, in various embodiments of the present invention, glass compositions for a front contact may be found in Table 1. Glass compositions for back contacts may be found in Table 2. More than one glass composition can be used, and compositions comprising amounts from different columns in the same table are also envisioned. Regardless of the number of glass compositions used, the total content of $Bi_2O_3$ and $SiO_2$ in the glass component preferably falls within the range of about 5 to about 85 mol % $Bi_2O_3$ and from about 1 to about 70 mol % $SiO_2$. If a second glass composition is used, the proportions of the glass compositions can be varied to control the extent of paste interaction with silicon, and hence the resultant solar cell properties. For example, within the glass component, the first and second glass compositions may be present in a weight ratio of about 1:20 to about 20:1, and preferably about 1:3 to about 3:1. The glass component preferably contains no lead or oxides of lead, and no cadmium or oxides of cadmium.

TABLE 1

Oxide frit ingredients for front contact glasses in mole percent.

| Ingredient | Glass Composition | | |
|---|---|---|---|
| | I | II | III |
| Bi2O3 | 5–85 | 15–80 | 50–80 |
| SiO2 | 1–70 | 2–45 | 15–35 |
| ZnO | 0–55 | 0.1–25 | 1–15 |
| V2O5 | 0–30 | 0.1–25 | 1–15 |

TABLE 2

Oxide frit ingredients for back contact glasses in mole percent.

| Ingredient | Glass Composition | | |
|---|---|---|---|
| | IV | V | VI |
| Bi2O3 | 5–65 | 5–55 | 10–40 |
| SiO2 | 15–70 | 20–70 | 30–65 |
| B2O3 | 0–35 | 0.1–35 | 3–20 |
| Alkali oxides | 0–35 | 0.1–25 | 5–25 |

In addition to the oxides of Table 1 and Table 2, additional oxides may be included in the glass component, for example about 1 to about 20 mol % of a trivalent oxide of one or more of Al, B, La, Y, Ga, In, Ce, and Cr; about 0.1 to about 15 mol % of a tetravalent oxide of one or more of Ti, Zr and Hf; about 0.1 to about 20 mol % of a pentavalent oxide of one or more of P, Ta, Nb, and Sb. $Ag_2O$ may be included in the silver paste glass as a source of silver, from about 0.1 to about 12 mol %.

Metal Component. In a solar cell contact, the metal must be conductive. In a front contact, the metal component comprises silver. The source of the silver can be one or more fine powders of silver metal, or alloys of silver. A portion of the silver can be added as silver oxide ($Ag_2O$) or as silver salts such as silver chloride (AgCl), silver nitrate ($AgNO_3$) or silver acetate ($AgOOCCH_3$). The silver particles used in the paste may be spherical, flaked, or provided in a colloidal suspension, and combinations of the foregoing may be used. For example the solids portion of the paste may comprise about 80 to about 99 wt % spherical silver particles or alternatively about 75 to about 90 wt % silver particles and about 1 to about 10 wt % silver flakes. Alternatively the solids portion may comprise about 75 to about 90 wt % silver flakes and about 1 to about 10 wt % of colloidal silver, or about 60 to about 95 wt % of silver powder or silver flakes and about 0.1 to about 20 wt % of colloidal silver. Suitable commercial examples of silver particles are spherical silver powder Ag3000-1, silver flakes SF-29, and colloidal silver suspension RDAGCOLB, all commercially available from Ferro Corporation, Cleveland, Ohio.

In a back contact, the metal component comprises aluminum or alloys of aluminum. The aluminum metal component may come in any suitable form, including those noted hereinabove for silver in the front contact.

For a silver rear contact, the metal component may comprise silver or a combination of both silver and aluminum pastes as disclosed hereinabove.

Other Additives. Up to about 30wt % of other (i.e., inorganic) additives, preferably up to about 25 wt % and more preferably up to about 20 wt %, may be included as needed. Phosphorus can be added to the paste in a variety of ways to reduce the resistance of the front contacts. For example, certain glasses can be modified with $P_2O_5$ in the form of a powdered or fritted oxide, or phosphorus can be added to the paste by way of phosphate esters or other organo-phosphorus compounds. More simply, phosphorus can be added as a coating to silver particles prior to making a paste. In such case, prior to pasting, the silver particles are mixed with liquid phosphorus and a solvent. For example, a blend of from about 85 to about 95 wt % silver particles, from about 5 to about 15 wt % solvent and from about 0.5 to about 10 wt % liquid phosphorus is mixed and the solvent evaporated. Phosphorus coated silver particles help ensure intimate mixing of phosphorus and silver in the inventive silver pastes.

Other additives such as fine silicon or carbon powder, or both, can be added to control the reactivity of the metal component with silicon. For example these fine silicon or carbon powder can be added to the front contact silver paste to control the silver reduction and precipitation reaction. The silver precipitation at the Ag/Si interface or in the bulk glass, for the silver pastes in both front contacts and silver rear contacts, can also be controlled by adjusting the firing atmosphere (e.g., firing in flowing $N_2$ or $N_2/H_2/H_2O$ mixtures). Fine particles of low melting metal additives (i.e., elemental metallic additives as distinct from metal oxides) such as Pb, Bi, In, Ga, Sn, and Zn and alloys of each with at least one other metal can be added to provide a contact at a lower temperature, or to widen the firing window. Zinc is the preferred metal additive, and a zinc-silver alloy is most preferred for the front contact.

A mixture of (a) glasses or a mixture of (b) crystalline additives and glasses or a mixture of (c) one or more crystalline additives can be used to formulate a glass component in the desired compositional range. The goal is to reduce the contact resistance and improve the solar cell electrical performance. For example, second-phase crystalline materials such as $Bi_2O_3$, $Sb_2O_3$, $In_2O_3$, $Ga_2O_3$, SnO, ZnO, $SiO_2$, $ZrO_2$, $Al_2O_3$, $B_2O_3$, $V_2O_5$, $Ta_2O_5$, various alumino-silicates, bismuth borates, bismuth silicates such as $6Bi_2O_3.SiO_2$, $Bi_2O_3.SiO_2$, $2Bi_2O_3.3SiO_2$, $12Bi_2O_3.SiO_2$, $2Bi_2O_3.SiO_2$, $3Bi_2O_3.5SiO_2$ and $Bi_2O_3.4SiO_2$, bismuth titanantes such as $Bi_2O_3.2TiO_2$, $2Bi_2O_3.3TiO_2$, $2Bi_2O_3.4TiO_2$, and $6Bi_2O_3.TiO_2$, various vanadates such as $MgO.V_2O_5$, $CaO.V_2O_5$, $BaO.V_2O_5$, $Zn.V_2O_5$, $Na_2O.17V_2O_5$, $K_2O.4V_2O_5$, $2Li_2O.5V_2O_5$, and bismuth vanatades such as $6Bi_2O_3.V_2O_5$, $BiVO_4$, $2Bi_2O_3.3V_2O_5$, and $BiV_3O_9$, bismuth vanadium titanates such as $6.5Bi_2O_3.2.5V_2O_5.Tio_2$, zinc titanates such as $2ZnO.3TiO_2$, zinc silicates such as $ZnO.SiO_2$, zirconium silicates such as $ZrO_2.SiO_2$, and reaction products thereof and combinations thereof may be added to the glass component to adjust contact properties. However, the total amounts of the above oxides must fall within the ranges specified for various embodiments disclosed elsewhere herein.

Organic Vehicle. The pastes herein include a vehicle or carrier which is typically a solution of a resin dissolved in a solvent and, frequently, a solvent solution containing both resin and a thixotropic agent. The organics portion of the pastes comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, resin, thixotrope, and/or wetting agent is also envisioned. Although a variety of weight ratios of the solids portion to the organics portion are envisioned, one embodiment includes a weight ratio of the solids portion to the organics portion from about 20:1 to about 1:20, preferably about 15:1 to about 1:15, and more preferably about 10:1 to about 1:10.

Ethyl cellulose is a commonly used resin. However, resins such as ethyl hydroxyethyl cellulose, wood rosin, mixtures of ethyl cellulose and phenolic resins, polymethacrylates of lower alcohols and the monobutyl ether of ethylene glycol monoacetate can also be used. Solvents having boiling points (1 atm) from about 130° C. to about 350° C. are suitable. Widely used solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate. The vehicle can contain organometallic compounds, for example those based on nickel, phosphorus or silver, to modify the contact. N-DIFFUSOL® is a stabilized liquid preparation containing an n-type diffusant with a diffusion coefficient similar to that of elemental phosphorus. Various combinations of these and other solvents can be formulated to obtain the desired viscosity and volatility requirements for each application. Other dispersants, surfactants and rheology modifiers, which are commonly used in thick film paste formulations, may be included. Commercial examples of such products include those sold under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.).

Among commonly used organic thixotropic agents is hydrogenated castor oil and derivatives thereof. A thixotrope is not always necessary because the solvent coupled with the shear thinning inherent in any suspension may alone be suitable in this regard. Furthermore, wetting agents may be employed such as fatty acid esters, e.g., N-tallow-1,3-diaminopropane dioleate; N-tallow trimethylene diamine diacetate; N-coco trimethylene diamine, beta diamines; N-oleyl trimethylene diamine; N-tallow trimethylene diamine; N-tallow trimethylene diamine dioleate, and combinations thereof.

It should be kept in mind that the foregoing compositional ranges are preferred and it is not the intention to be limited to these ranges where one of ordinary skill in the art would recognize that these ranges may vary depending upon specific applications, specific components and conditions for processing and forming the end products.

Paste Preparation. The paste according to the present invention may be conveniently prepared on a three-roll mill. The amount and type of carrier utilized are determined mainly by the final desired formulation viscosity, fineness of grind of the paste, and the desired wet print thickness. In preparing compositions according to the present invention, the particulate inorganic solids are mixed with the vehicle and dispersed with suitable equipment, such as a three-roll mill, to form a suspension, resulting in a composition for which the viscosity will be in the range of about 100 to about 500 kcps, preferably about 300 to about 400 kcps, at a shear rate of 9.6 $sec^{-1}$ as determined on a Brookfield viscometer HBT, spindle 14, measured at 25° C.

Printing and Firing of the Pastes. The aforementioned paste compositions may be used in a process to make a solar cell contact or other solar cell components. The inventive method of making solar cell front contact comprises (1) applying a silver-containing paste to the silicon substrate, (2) drying the paste, and (3) firing the paste to sinter the metal and make contact to silicon. The printed pattern of the paste is fired at a suitable temperature, such as about 650-950° C. furnace set temperature, or about 550-850° C. wafer temperature. Preferably, the furnace set temperature is about 750-930° C., and the paste is fired in air. During the firing the antireflective $SiN_X$ layer is believed to be oxidized and corroded by the glass and Ag/Si islands are formed on reaction with the Si substrate, which are epitaxially bonded to silicon. Firing conditions are chosen to produce a sufficient density of Ag/Si islands on the silicon wafer at the silicon/paste interface, leading to a low resistivity, high efficiency, high-fill factor front contact and solar cell.

The lead-free silver pastes herein can also be used to form a backside Ag silver rear contact. A method of making a backside Ag silver rear contact comprises: (1) applying a silver paste to the P-side of a silicon wafer in bus-bar configuration, (2) drying the paste, (3) printing and drying a Al-back contact paste, (4) applying and drying the above mentioned silver front contact paste, and (5) co-firing all three pastes, at a suitable temperature, such as about 650-950° C. furnace set temperature; or about 550-850° C. wafer temperature.

The inventive method of making solar cell back contact comprises: (1) applying an Al-containing paste to the P-side of a silicon wafer on which back silver rear contact paste is already applied and dried, (2) drying the paste, and (3) applying the front contact silver paste, and (4) co-firing the front contact, silver rear contact, and Al-back contact. The solar cell printed with silver rear contact Ag-paste, Al-back contact paste, and Ag-front contact paste is fired at a suitable temperature, such as about 650-950° C. furnace set temperature; or about 550-850° C. wafer temperature. During firing Al as the wafer temperature rises above Al—Si eutectic temperature of 577° C., the back contact Al dissolves Si from the substrate and liquid Al—Si layer is formed. This Al—Si liquid continues to dissolve substrate Si into it during further heating to peak temperature. During the cool down period, Si precipitates back from Al—Si melt. This precipitating Si grows as an epitaxial layer on the underlying Si substrate and forms a purer $p^+$ layer. When the cooling melt reaches Al—Si eutectic temperature the remaining liquid freezes as Al—Si eutectic layer. A purer P+ layer is believed to provide a back surface field (BSF), which in turn increases the solar cell performance. So the glass in Al-back contact should optimally interact with both Al and Si without unduly affecting the formation of an efficient BSF layer.

A typical ARC is made of a silicon compound such as silicon nitride, generically $SiN_x$, such as $Si_3N_4$, and it is generally on the front contact side of silicon substrate. This ARC layer acts as an insulator, which tends to increase the contact resistance. Corrosion of this ARC layer by the glass component is hence a necessary step in front contact formation. Reducing the resistance between the silicon wafer and the paste improves solar cell efficiency and is facilitated by the formation of epitaxial silver/silicon conductive islands at the front contact Ag/Si interface. That is, the silver islands on silicon assume the same crystalline structure as is found in the silicon substrate. Until now, the processing conditions to achieve a low resistance epitaxial silver/silicon interface have involved the use of Ag pastes that contain leaded glasses. The lead free Ag-pastes and processes herein now make it possible to produce an epitaxial silver/silicon interface leading to a contact having low resistance under broad processing conditions—a firing temperature as low as about 650° C., and as high as about 850° C. (wafer temperature)—to produce lead free front contacts. The lead-free pastes herein can be fired in air; i.e., where no special atmospheric conditions are required.

The formation of a low resistance lead-free front contact on a silicon solar cell is technically challenging. Both the interactions among paste constituents (silver metal, glass, additives, organics), and the interactions between paste constituents and silicon substrate are complex, yet must be controlled. The rapid furnace processing makes all the reactions highly dependent on kinetics. Further, the reactions of interest must take place within a very narrow region (<0.5 micron) of silicon in order preserve the P-N junction. Similarly the formation of lead-free back contacts on a silicon solar cell is technically challenging.

Method of Front Contact Production. A solar cell front contact according to the present invention can be produced by applying any Ag paste produced by mixing silver powders with lead free and cadmium-free glasses disclosed in Table 1 to the N-side of the silicon substrate pre coated with back Ag silver rear contact paste and Al back contact paste, for example by screen printing, to a desired wet thickness, e.g., from about 40 to 80 microns.

Method of Silver Rear Contact Production. A solar cell silver rear contact according to the present invention can be produced by applying any Ag paste produced by mixing silver or silver alloy powders with lead free glasses disclosed in Table 1 to the P-side of the silicon substrate, for example by screen printing, to a desired wet thickness, e.g., from about 40 to 80 microns.

Method of Back Contact Production. A solar cell back contact according to the present invention can be produced by applying any Al paste produced by mixing aluminum powders with lead free glasses disclosed in Table 2 to the P-side of the silicon substrate pre coated with silver rear contact paste, for example by screen printing, to a desired wet thickness, e.g., from about 30 to 50 microns.

Common to the production of front contacts, back contacts and silver rear contacts is the following. Automatic screen printing techniques can be employed using a 200-325 mesh screen. The printed pattern is then dried at 200° C. or less, preferably at about 120° C. for about 5-15 minutes before firing. The dry printed pattern can be co fired with silver rear contact and Al back contact pastes for as little as 1 second up to about 5 minutes at peak temperature, in a belt conveyor furnace in air.

Nitrogen ($N_2$) or another inert atmosphere may be used if desired, but it is not necessary. The firing is generally according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures. For example a three-zone firing profile may be used, with a belt speed of about 1 to about 4 meters (40-160 inches) per minute. Naturally, firing arrangements having more than 3 zones are envisioned by the present invention, including 4, 5, 6, or 7, zones or more, each with zone lengths of about 5 to about 20 inches and firing temperatures of 650 to 1000° C.

EXAMPLES

Polycrystalline silicon wafers, 12.5 cm×12.5 cm, thickness 250-300 μm, were coated with a silicon nitride antireflective coating on the N-side of Si. The sheet resistivity of these wafers was about 1 Ω-cm. Exemplary lead-free and cadmium-free glasses of this invention are listed in Table 3.

TABLE 3

Exemplary Glass Compositions

| | Glass | | | | |
|---|---|---|---|---|---|
| | G | I | J | L | M |
| | | | Mole % | | |
| $Bi_2O_3$ | 60 | 60 | 75 | 35.8 | 21.57 |
| $SiO_2$ | 35 | 30 | 20 | 35.5 | 43.9 |
| ZnO | 5 | | | | 9.7 |
| $B_2O_3$ | | | | 7.2 | 10.0 |
| $Al_2O_3$ | | 10 | | | |
| $V_2O_5$ | | | 5 | | |
| $Li_2O$ | | | | | 10.5 |
| $Na_2O$ | | | | | 2.5 |
| $K_2O$ | | | | 21.5 | |
| $Nb_2O_5$ | | | | | 1.86 |

Exemplary Ag- or Al-paste formulations in Table 4 were made with commonly used 2~5 μm silver powders or flakes and 4~10 μm aluminum powders, and the organic vehicles V131, V132, V148, V205, and V450 commercially available from Ferro Corporation, Cleveland, Ohio. N-Diffusol is commercially available from Transene Co. Inc., Danvers, Mass. Anti-Terra 204 is a wetting agent commercially available from BYK-Chemie GmbH, Wesel, Germany. Cabosil® is fumed silica, commercially available from Cabot Corporation, Billerica Mass. All amounts in Table 4 are in weight percent of the paste, including the solids portion and the organics portion.

TABLE 4

Exemplary Pb-free Paste Formulations

| | Paste | | | |
|---|---|---|---|---|
| | 1 | 2 | 3 | 4 |
| | | | Type | |
| | front | front | back | silver rear contact |
| | | | Glass component | |
| Ingredients in wt % | I | J | L | M |
| Glass component in paste | 4.7 | 4.5 | 1.6 | 5 |
| Silver | 80.9 | 78.0 | | 69.9 |
| Aluminum | | | 78.2 | |
| Cabosil | | | 0.4 | |
| Vehicle V131 | 1.1 | 3.5 | | 10.4 |
| Vehicle V132 | 8.8 | 13.5 | | 14.7 |
| Vehicle V148 | 4.1 | | | |
| Vehicle V205 | | | 7.25 | |
| Vehicle V450 | | | 3.75 | |
| Texanol | | | 7.8 | |

TABLE 4-continued

Exemplary Pb-free Paste Formulations

| | Paste | | | |
|---|---|---|---|---|
| | 1 | 2 | 3 | 4 |
| | | | Type | |
| | front | front | back | silver rear contact |
| | | | Glass component | |
| Ingredients in wt % | I | J | L | M |
| Anti-Terra 204 | | | 1.0 | |
| N-diffusol | 0.4 | 0.5 | | |

The exemplary lead-free pastes in Table 4 were printed either as front contact or back silver rear contact or back contact on a silicon solar cell and their solar cell properties are compared to the prior art lead containing pastes as shown in Table 5. The other two pastes were accordingly commercially available front contact (CN33-462) or silver rear contact (3368, 33-451, or 33-466) or Al back contact (FX53-038, or CN53-100 or CN53-101) pastes from Ferro corporation, Cleveland, Ohio. The front contact pattern was printed using a 280 mesh screen with 100 μm openings for finger lines and with about 2.8 mm spacing between the lines. The silver rear contact and back contact pastes were printed using 200 mesh screen. The printed wafers were co-fired using a 3-zone infrared (IR) belt furnace with a belt speed of about 3 meters (120") per minute, with temperature settings of 780° C., 810° C., and 930 to 970° C. for the three zones. The zones were 7", 16", and 7" long, respectively. For the front contact Ag lines the fired finger width for most samples was about 120 to 170 μm and the fired thickness was about 10 to 15 μm.

These lead free pastes and their comparative prior art lead pastes were fired side by side according to the aforementioned firing profile. Electrical performance of these solar cells was measured with a solar tester, Model 91193-1000, Oriel Instrument Co., Stratford, Conn., under AM 1.5 sun conditions, in accordance with ASTM G-173-03. The electrical properties of the resultant solar cells are set forth in Table 5.

TABLE 5

Properties of Solar cells made with Pb-free pastes of Table 4 compared to the corresponding prior art lead containing pastes.

| | Paste | | | | | | | |
|---|---|---|---|---|---|---|---|---|
| | 1 | Prior art CN33-462 | 2 | Prior art CN33-462 | 3 | Prior art FX53-038 | 4 | Prior art 3398 |
| | | | | PasteType | | | | |
| | Lead free | leaded | | Leaded | | Leaded | | Leaded |
| | | | | Glass | | | | |
| | I | | J | | L | | M | |
| | | | | Glass Type | | | | |
| | Pb-free | Pb | Pb-free | Pb | Pb-free | Pb | Pb-free | Pb |
| Isc, A | 5.653 | 5.718 | 5.087 | 5.177 | 4.966 | 5.079 | 4.942 | 4.920 |
| Voc, mV | 601 | 609 | 610 | 609 | 600 | 606 | 606 | 603 |
| Efficiency, % | 13.10 | 15.49 | 14.91 | 15.18 | 13.96 | 13.39 | 13.6 | 13.4 |
| Fill Factor, % | 59.8 | 69.0 | 75.0 | 75.1 | 73.1 | 67.7 | 70.6 | 70.5 |
| Rs, mΩ | 21 | 10.0 | 8.8 | 8.0 | 11.0 | 14.0 | 14.0 | 13.0 |
| Rsh, Ω | 3.47 | 4.12 | 12.8 | 17.3 | 9.45 | 5.88 | 8.0 | 6.7 |

The prior art pastes 3398, CN33-462, FX53-038 are commercially available from Ferro Corporation, Cleveland, Ohio. Isc means short circuit current, measured at zero output voltage; Voc means open circuit voltage measured at zero output current; $R_S$ and $R_{sh}$ were previously defined. The terms Efficiency and Fill Factor are known in the art.

Table 5 clearly shows the invented lead free pastes give solar cell properties comparable to appropriate prior art lead containing pastes. Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

What is claimed is:

1. A solar cell contact comprising, prior to firing:
   A silicon semiconductor wafer;
   A composition deposited on the silicon semiconductor wafer, the composition comprising:

a. A solids portion and
b. An organics portion,
c. Wherein the solids portion comprises
  i. From about 85 to about 99 wt % of a conductive metal component silver, and
  ii. From about 1 to about 15 wt % of a glass component, wherein the glass component is lead-free and cadmium-free, the glass component including from 50 to 80 mol % $Bi_2O_3$, from 15 to 35 mol % $SiO_2$, from 1 to 15 mol % ZnO and from 1 to 15 mol % $V_2O_5$;
wherein the glass component includes a second-phase crystalline material selected from the group consisting of alumino-silicates, bismuth borates, bismuth silicates, bismuth titanates, vanadates, bismuth vanadates, bismuth vanadium titanates, zinc borates, zinc titanates, zinc silicates, zirconium silicates, and reactions products thereof and combinations thereof.

2. The solar cell contact of claim 1 wherein the silicon semiconductor wafer includes an N-side and a P-side.

3. The solar cell contact of claim 2 wherein the composition is deposited on the N-side of the silicon semiconductor wafer.

4. The solar cell contact of claim 2 wherein the composition is deposited on the P-side of the silicon semiconductor wafer.

5. The solar cell contact of claim 1 wherein the glass component further comprises from about 0.1 to about 20 mol % of pentavalent oxide selected from the group consisting of P, Ta, Nb, and Sb.

6. The solar cell contact of claim 1 wherein the second phase crystalline material is bismuth borate.

7. The solar cell contact of claim 1 wherein the second phase crystalline material is bismuth silicate and the bismuth silicate is selected from the group consisting of $6Bi_2O_3.SiO_2$, $Bi_2O_3.SiO_2$, $2Bi_2O_3.3SiO_2$, $12Bi_2O_3.SiO_2$, $2Bi_2O_3.SiO_2$, $3Bi_2O_3.5SiO_2$ and $Bi_2O_3.4SiO_2$.

8. The solar cell contact of claim 1 wherein the second phase crystalline material is bismuth titanate and the bismuth titanate is selected from the group consisting of $Bi_2O_3.2TiO_2$, $2Bi_2O_3.3TiO_2$, $2Bi_2O_3.4TiO_2$, and $6Bi_2O_3.TiO_2$.

9. The solar cell contact of claim 1 wherein the second phase crystalline material is a vanadate and the vanadate is selected from the group consisting of $MgO.V_2O_5$, $SrO.V_2O_5$, $CaO.V_2O_5$, $BaO.V_2O_5$, $ZnO.V_2O_5$, $Na_2O.17V_2O_5$, $K_2O.4V_2O_5$, and $2Li_2O.5V_2O_5$.

10. The solar cell contact of claim 1 wherein the second phase crystalline material is bismuth vanadate and the bismuth vanadate is selected from the group consisting of $6Bi_2O_3.V_2O_5$, $BiVO_4$, $2Bi_2O_3.3V_2O_5$, and $BiV_3O_9$.

11. The solar cell contact of claim 1 wherein the second phase crystalline material is bismuth vanadium titanate and the bismuth vanadium titanate is $6.5Bi_2O_3.2.5V_2O_5.TiO_2$.

12. The solar cell contact of claim 1 wherein the second phase crystalline material is zinc titanate and the zinc titanate is $2ZnO.3TiO_2$.

13. The solar cell contact of claim 1 wherein the second phase crystalline material is zinc silicate and the zinc silicate is $ZnO.SiO_2$.

14. The solar cell contact of claim 1 wherein the second phase crystalline material is zirconium silicate and the zirconium silicate is $ZrO_2.SiO_2$.

15. The solar cell contact of claim 1 wherein the second phase crystalline material is zinc borate and the zinc borate is $ZnO*B_2O_3$.

16. The solar cell contact of claim 1 wherein the composition is fired for a time period of from 1 second to 5 minutes.

17. The solar cell contact of claim 16 wherein the composition is fired for a time period of from 1 second to 3 minutes.

18. The solar cell contact of claim 1 wherein the silver component comprises silver selected from the group consisting of flakes, powder, or colloidal particles of silver.

19. The solar cell contact of claim 18 wherein the solids portion further comprises phosphorus, at least a portion of which is present as a coating on at least a portion of the silver flakes, powder, or colloidal particles.

20. The solar cell contact of claim 1 wherein the solids portion comprises from about 3 to about 8 wt % of the glass component.

21. A solar cell contact comprising, prior to firing:
A silicon semiconductor wafer;
A composition deposited on the silicon semiconductor wafer, the composition comprising:
d. A solids portion and
e. An organics portion,
f. Wherein the solids portion comprises
  i. From about 85 to about 99 wt % of a conductive metal component silver, and
  ii. From about 1 to about 15 wt % of a glass component, wherein the glass component comprises:
    15 to 80 mol % $Bi_2O_3$;
    2 to 45 mol % $SiO_2$;
    0.1 to 25 mol % ZnO; and
    0.1 to 25 mol % $V_2O_5$;
wherein the glass component includes a second-phase crystalline material selected from the group consisting of alumino-silicates, bismuth borates, bismuth silicates, bismuth titanates, vanadates, bismuth vanadates, bismuth vanadium titanates, zinc borates, zinc titanates, zinc silicates, zirconium silicates, and reactions products thereof and combinations thereof.

22. The solar cell contact of claim 21 wherein the glass component comprises:
50 to 80 mol % $Bi_2O_3$;
15 to 35 mol % $SiO_2$;
1 to 15 mol % ZnO; and
1 to 15 mol % $V_2O_5$.
wherein the silver component comprises silver selected from the group consisting of flakes, powder, or colloidal particles of silver, wherein the solids portion further comprises phosphorus, at least a portion of which is present as a coating on at least a portion of the silver flakes, powder, or colloidal particles.

23. The solar cell contact of claim 21 wherein the glass component further comprises from about 0.1 to about 20 mol % of pentavalent oxide selected from the group consisting of P, Ta, Nb, and Sb.

24. The solar cell contact of claim 21 wherein the glass component consists essentially of:
15 to 80 mol % $Bi_2O_3$;
2 to 45 mol % $SiO_2$;
0.1 to 25 mol % ZnO; and
0.1 to 25 mol % $V_2O_5$.

25. The solar cell contact of claim 21 wherein the glass component consists essentially of:
50 to 80 mol % $Bi_2O_3$;
15 to 35 mol % $SiO_2$;
1 to 15 mol % ZnO; and
1 to 15 mol % $V_2O_5$.

26. A solar cell contact comprising, prior to firing:
A silicon semiconductor wafer;
A composition deposited on the silicon semiconductor wafer, the composition comprising:
a. A solids portion and
b. An organics portion,
c. Wherein the solids portion comprises i. From about 85 to about 99 wt % of a conductive metal component silver, and
ii. From about 1 to about 15 wt % of a glass component, wherein the glass component comprises:
10 to 40 mol % $Bi_2O_3$;
30 to 65 mol % $SiO_2$;
3 to 20 mol % $B_2O_3$; and
5 to 25 mol % alkali oxides;
wherein the glass component includes a second-phase crystalline material selected from the group consisting of alumino-silicates, bismuth borates, bismuth silicates, bismuth titanates, vanadates, bismuth vanadates, bismuth vanadium titanates, zinc borates, zinc titanates, zinc silicates, zirconium silicates, and reactions products thereof and combinations thereof.

27. The solar cell contact of claim 26 wherein the glass component consists essentially of:
10 to 40 mol % $Bi_2O_3$;
30 to 65 mol % $SiO_2$;
3 to 20 mol % $B_2O_3$; and
5 to 25 mol % alkali oxides.

* * * * *